US006968296B2

(12) United States Patent
Royle (10) Patent No.: US 6,968,296 B2
(45) Date of Patent: Nov. 22, 2005

(54) CABLE DETECTOR WITH DECIMATING FILTER AND FILTERING METHOD

(75) Inventor: John Mark Royle, Exeter (GB)

(73) Assignee: Radiodetection Limited, Bristol (GB)

( * ) Notice: Subject to any disclaimer, the term of this patent is extended or adjusted under 35 U.S.C. 154(b) by 14 days.

(21) Appl. No.: 10/406,597

(22) Filed: Apr. 4, 2003

(65) Prior Publication Data

US 2004/0215426 A1 Oct. 28, 2004

(51) Int. Cl.[7] .............................................. G06F 15/00
(52) U.S. Cl. ...................................................... 702/190
(58) Field of Search ................................ 702/191–194, 702/197, 75, 189, 190, 127

(56) References Cited

U.S. PATENT DOCUMENTS

| 5,212,659 | A | | 5/1993 | Scott et al. | |
|---|---|---|---|---|---|
| 5,561,660 | A | * | 10/1996 | Kotowski et al. | 370/215 |
| 5,729,483 | A | | 3/1998 | Brown | |
| 5,757,867 | A | * | 5/1998 | Caulfield et al. | 375/350 |
| 5,793,818 | A | | 8/1998 | Claydon et al. | 375/326 |
| 6,317,765 | B1 | | 11/2001 | Page et al. | 708/313 |
| 6,321,246 | B1 | | 11/2001 | Page et al. | 708/316 |
| 6,603,812 | B1 | * | 8/2003 | Oprescu | 375/232 |
| 6,771,720 | B1 | * | 8/2004 | Yang et al. | 375/345 |
| 6,774,822 | B1 | * | 8/2004 | Thomson | 341/61 |
| 2002/0126028 | A1 | * | 9/2002 | Feste et al. | 341/120 |
| 2003/0172098 | A1 | * | 9/2003 | Jiang et al. | 708/313 |
| 2003/0235245 | A1 | * | 12/2003 | Erdogan et al. | 375/232 |
| 2004/0088343 | A1 | * | 5/2004 | Cannon | 708/306 |

FOREIGN PATENT DOCUMENTS

EP 1089507 A2 9/2000

* cited by examiner

Primary Examiner—Michael Nghiem
Assistant Examiner—Demetrius Pretlow
(74) Attorney, Agent, or Firm—Baker & Hostetler LLP (57) ABSTRACT

A cable detection or location device is disclosed having a detection stage to produce a detection signal, a decimating filter having an input and an output, the input being coupled to the receiving stage to filter the detection signal and output a down-sampled filtered signal with a decimation ratio of N, and an output stage, coupled to the output of the decimating filter, to output an indication signal based upon the down-sampled filtered signal. The decimating filter used is a Finite Impulse Response (FIR) filter having a frequency response corresponding to that of a cascade of m SINC filters, wherein m is an integer greater than 1. A method of decimating a signal in a device is also disclosed.

23 Claims, 8 Drawing Sheets

CABLE DETECTOR WITH DECIMATING FILTER AND FILTERING METHOD

FIELD OF THE INVENTION

The present invention relates to devices to detect or locate cables or other underground or otherwise inaccessible objects, the devices having decimating filtering.

BACKGROUND OF THE INVENTION

In devices for detecting and/or locating cables or underground objects, a high selectivity in a narrow bandwidth is important in order to maximise instrument sensitivity. In digital signal processing, such selectivity can, in part, be obtained by using SINC filters. Such SINC filters are useful because they allow exact control of high frequencies, and predictable aliasing thereof. It is simple to arrange such SINC filters so that the aliased frequencies fall outside the bandwidth of a filter that computes at a down-sampled rate. Generally, a cascade of SINC filters, with nomenclature $SINC^n$, where n is the number, or order, of cascaded SINC filters, is used in order to decimate, i.e. to reduce the rate of a signal from the sampling rate to a down-sampled rate. The ratio of sampling rate to down-sampled rate is called the decimation ratio.

Cable detection and location devices are generally portable devices, for use in a number of environments. Therefore, power consumption is an important factor in the design of such devices. Low power consumption allows the design to be more compact and allows for longer operating periods. Considerations in such power requirements include the power consumption of the data processing elements of the device. The simpler the processor that can be used, in general the lower the power requirements. Modern DSP architecture and semiconductor technology allow low cost 32 bit floating point devices with computational engines operating at 0.25 mW/MIP. 64 bit processors are also available; however, these have much higher power requirements and are generally unsuitable for low power applications.

Two available methods of calculating the frequency response of a $SINC^n$ filter in a Digital Signal Processor (DSP) are by use of modular arithmetic followed by a number of differentiators, and the use of recursive filtering. The first method involves modular arithmetic for the summing process and is followed by a number of differentiators, operating after the down-sampling stage, to reconvert the modular representation. In an example, such a modular arithmetic method, in order to accurately represent a cascade of 5 SINC filters, without unacceptable truncation, with a total decimation ratio of 240 would require a 72 bit accumulator. While the method is computationally efficient, it is not suitable for low computation implementation of a $5^{th}$ order decimating filter on a 32 bit processor because of the need for a 72 bit accumulator.

The second method makes use of a cascade of Infinite Impulse Response (IIR) recursive filters. Such a filter gives a highly accurate representation of a $SINC^n$. A simple difference equation can be used to determine the filter response for each stage of the filter:

$$y_n = y_{n-1} + x_n - x_{n-N}$$

where $y_n$ is the current output of the filter; $y_{n-1}$ is the previous output from the filter; $x_n$ is the current input to the filter; and $X_{n-N}$ is the input to the filter delayed by N samples (where N is the decimation ratio).

Such a filter is, once again, computationally efficient. However, because the response is recursive, any errors in each value are compounded as the filter runs. Because any processor will have a limited accuracy, the recursion will cause truncation errors when the filter is run continuously. These truncation errors lead to gain instability in the filter. With a 32 bit processor these errors become too large for the IIR filter to be useful, as the accuracy of the processor is only 24 bit (24 bit mantissa, with 8 bit exponent).

Therefore, there is a need to improve the filter characteristics for representation of SINC decimating filters in the digital domain when used in devices for detecting and/or locating cables or other underground or otherwise inaccessible objects, in particular, when implemented on a low power processor, for example a 32 bit floating point processor.

SUMMARY OF THE INVENTION

According to a first aspect of the invention, there is provided a device for detecting and/or locating cables or other underground or otherwise inaccessible objects that uses a Finite Impulse Response (FIR) filter to implement a SINC filter. A SINC filter, in general, produces a moving average of the last N inputs into the filter. In an embodiment of the invention, the frequency response of the FIR filter corresponds to that of a SINC filter. In an embodiment, the frequency response corresponds to that of a $SINC^m$ filter, i.e. a cascade of m SINC filters connected in series. In an embodiment of the invention, the FIR filter acts as a decimating filter.

In an embodiment of the invention, the device comprises a filter system which comprises a decimating filter. In another embodiment of the invention the filter system also comprises a frequency selective filter. In an embodiment of the invention the frequency selective filter is a low pass filter, and in another embodiment the frequency selective filter is a further FIR filter.

In an embodiment of the invention, the device also comprises a detection stage, which produces a detection signal and which, in an embodiment, also pre-processes the detection signal. In an embodiment, the device also comprises an output stage, which receives a signal from the filter system, which is then output as an indication signal, which based on the filter output signal, and is indicative of any detection or location of a cable.

In Fourier analysis, convolution in the time domain equates to multiplication in the frequency domain. Therefore, in an embodiment of the invention, by using convolution in the time domain to calculate the coefficients, the response can simply be calculated by multiplication. In a modern DSP, multiplication can be performed as quickly as any other operation. Therefore, use of the principles of convolution theory provides a computationally efficient manner of calculation of the parameters of the filter.

Additionally, in an embodiment of the invention, the FIR filter of the device, acting as a decimating filter, emulating a $SINC^m$ filter, is run at the down-sampled data rate, rather than at the sampling frequency. Such a reduction in processing rate means that the processor has fewer computations per second and so has lower power consumption and more processor time is available for other processes.

In an embodiment, the coefficients of the FIR filter are calculated by convolving a rectangular aperture, with a width corresponding to the decimating ratio (N) of the filter, on itself a number of times equal to the order of the cascade of SINC filters. In an embodiment of the invention the coefficients of the delay stages, or taps, of the FIR filter are determined by using:

$$a_{m,n} = \sum_{k=n}^{n+N} a_{m-1,k};$$

where $a_{0,n}=0$ and $a_{0,N,m}=1$. The coefficients may be quasi static, i.e. calculated only when initiating the device, or only when changing the configuration of the device. Alternatively, the coefficients may be calculated at set time intervals, e.g. time multiples of the sampling rate, which may be as low as the sampling rate. The time intervals could be even lower than the sampling rate. The coefficients, as a function of the position within the aperture (i.e. the number of delay stages from the current input), give the normalised impulse response of the filter.

In an embodiment of the invention, the frequency response of the filter is defined by:

$$\sum_n \frac{a_{m,n}}{N^m} \cdot (Z(f))^{-n};$$

where f is frequency, $$Z(f) \text{ is } e^{\left(\frac{-2\pi i f}{f_s}\right)}$$

(discrete to frequency transfer function), $f_s$ is the sampling frequency and $$\frac{a_{m,n}}{N^m}$$

is the normalised impulse response. In an embodiment, the filter response is calculated by an 'inwardly walking' computation on the coefficients of the filter, i.e. computing the response from each of the tail edges of the impulse response in turn to the centre peak. In an embodiment of the invention, the decimation ratio of the filter is between 200 and 1000. In an embodiment, the decimation ratio is 240, and in another embodiment the ratio is 960. In an embodiment, the order of the filter is 5. In an embodiment where the sampling frequency is 48 kHz, N=240 and m=5 the FIR filter runs 1200 (240×5) computations in ~1/200 of a second. If the sampling frequency were the calculation rate of the filter, rather than the down-sampled rate, the number of calculations would be multiplied by 240, when compared to the down-sampled rate. The frequency response of a filter in an embodiment of the invention can shown to be the same as that of a theoretical SINC decimating filter by multiplying the normalised impulse response by the inverse Fourier transform of the frequency function.

According to an aspect of the invention, the FIR filter is implemented on a processor. In an embodiment, the processor is a 32 bit floating point processor, which is suited to both the calculation of the coefficients and to the implementation of the filter characteristics. In an embodiment of the invention, the coefficients of the FIR filter are calculated and stored in a memory and returned during operation of the processor as a decimating filter. Such FIR filters do not suffer from truncation problems, due to the finite history of inputs carried within the filters, and also can be calculated on a 32 bit processor while maintaining a 140 dB dynamic range. This high dynamic range makes this application of embodiments of the invention advantageous. The decimating filter grows the dynamic range of the detection signal such that a subsequent low pass filter of an embodiment of the invention can maximise the sensitivity and selectivity of the filtered detection signal.

According to a further aspect of the invention, the device is connectable to a communications network and data that represents instructions to the processor to calculate the coefficients, or that represents parameters of the coefficient generating algorithm, is downloaded and stored in the device. In an embodiment, the algorithm is not hard wired into the device, allowing the filter parameters and algorithm to be altered easily and remotely, because the coefficients can be calculated on initialisation of the device, or at regular intervals during operation of the device, using the data currently stored within the device. The communications network may be the internet or may be any other network supporting the transfer of data to the device. According to an embodiment, the device may be configured remotely, via the communications network.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Embodiments of the invention will now be described, purely by way of example, with reference to the accompanying drawings, in which.

DETAILED DESCRIPTION OF EMBODIMENTS OF THE INVENTION

Figure 1:
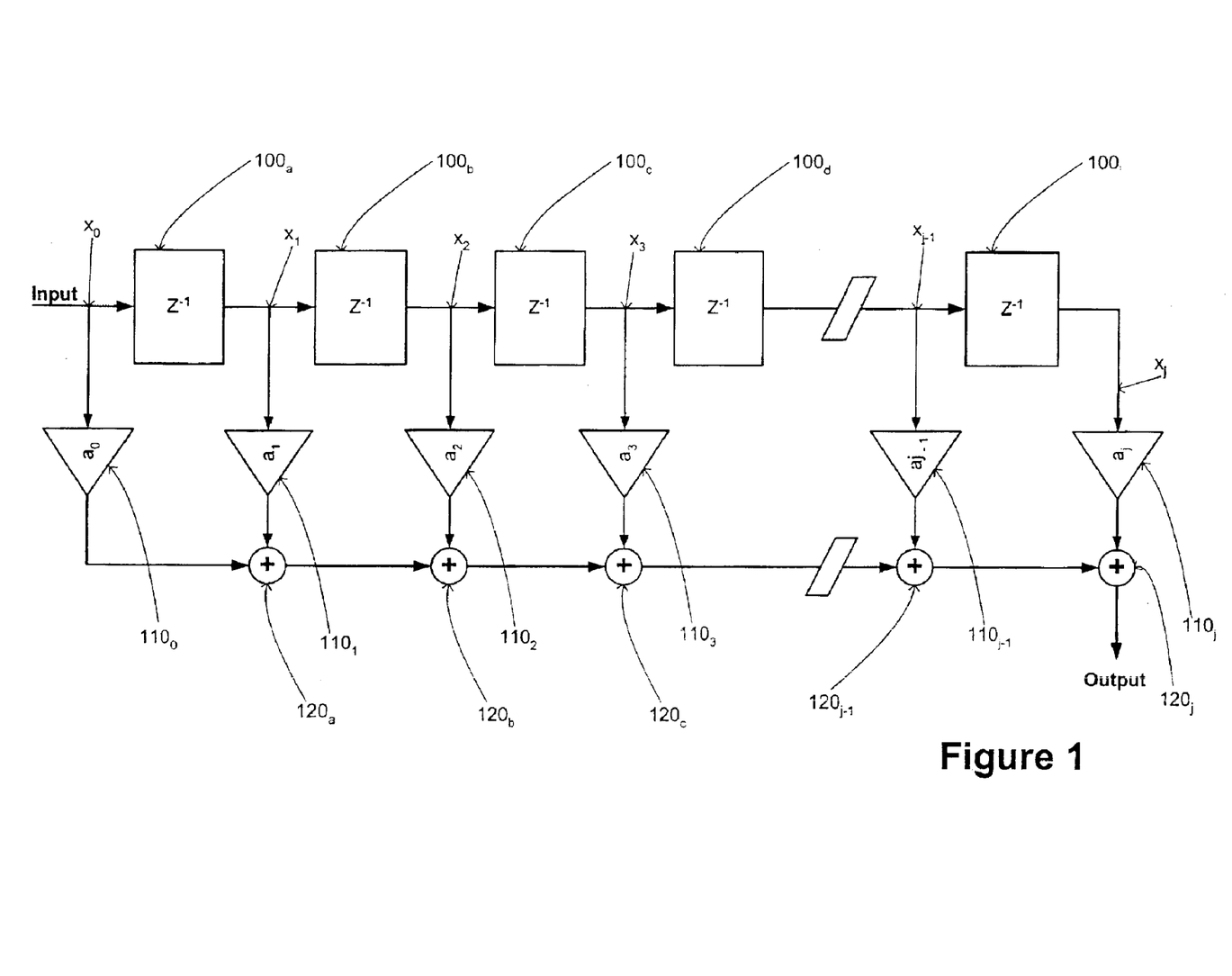
FIG. 1 shows a schematic block diagram of a Finite Impulse Response (FIR) filter for use in a device according to an embodiment of the invention.

FIG. 1 shows a typical FIR filter. The filter comprises n delay blocks $100_a, \ldots, 100_n$. Each delay block has an input value of $x_n$ and outputs the same signal received by it, but with a delay of $\Delta t$ as $x_{n+1}$. The filter also comprises j+1 gain blocks $110_0, \ldots, 110_j$. The gain of each gain block $110_0, \ldots 110_j$ is given by a coefficient $a_0, \ldots a_j$. The outputs from the gain blocks are added together by j adders $120_a, \ldots 120_j$.

In an embodiment of the invention, the coefficients $a_{m,n}$ (where m is the order of the convolution and n is an integer between 0 and j) are calculated by using the following formula:

$$a_{m,n} = \sum_{k=n}^{n+N} a_{m-1,k}; \quad [1]$$

between n=0 and n=N.m, where $a_{0,n}=0$ and $a_{0,N.m}=1$.

In the case where m=3, the formula is run for m−5, m−4, m−5, m−2, m−1 and m, in order to obtain the result for m=5. $a_{0,N.m}$ is set to equal 1 in order to seed the summation process. The formula represents the convolution of an aperture of width N and height N.m on itself m times. The results of this calculation of the coefficients are held in a look up table after derivation, to be used on implementation of the filter.

By looking at the FIR filter of FIG. 1, it can be seen that the effect of the filter is to create a moving sum averager. At any time, j time delayed samples $x_n$ are within the filter. In a step the new $j^{th}$ input $x_0$ received into the FIR filter and is multiplied by coefficient $a_0$. This $j^{th}$ input $x_0$ is then added to the $(j-1)^{th}$ value of the input $x_1$, which has been delayed by $\Delta t$, multiplied by coefficient $a_1$, and so on until the input where n=j/2. Then the oldest input $x_j$ still retained in the filter, which has been delayed by $N.\Delta t$ is multiplied by coefficient $a_j$ and added to the total, and the remaining results are calculated for the taps from n=j down to n=j/2+1. The sum of all of these is then output as a down-sampled rate sample output. When an output is produced and at the down sampling rate (i.e. every $\Delta t$), the gain blocks $110_0, \ldots 110_j$ and delay blocks $100_0, \ldots 100_j$ are readdressed in a circular manner, such that the input values and coefficients are each delayed by an extra $\Delta t$, as described in more detail below.

As stated above, FIR decimating filters need only sample at the down-sampled rate to output at the down-sampled rate. Therefore, in the case where m=5 and N=240, for each down-sampled output, 1200 instructions must be carried out, one for each of the gain blocks, or taps, of the FIR filter. Therefore, in this embodiment, j=1200. In each instruction cycle of the processor, a multiply-accumulate operation is carried out. Therefore, for a sampling frequency of 48 kHz, the down-sampled rate in the above case will be around 200 Hz, which the processor calculates at 240,000 instructions per second. Additionally, the FIR filter does not make use of recursion. Therefore, each sample input is used only a finite amount of times (N), and substantial truncation errors do not occur, and the associated gain instability is removed.

Figure 2:
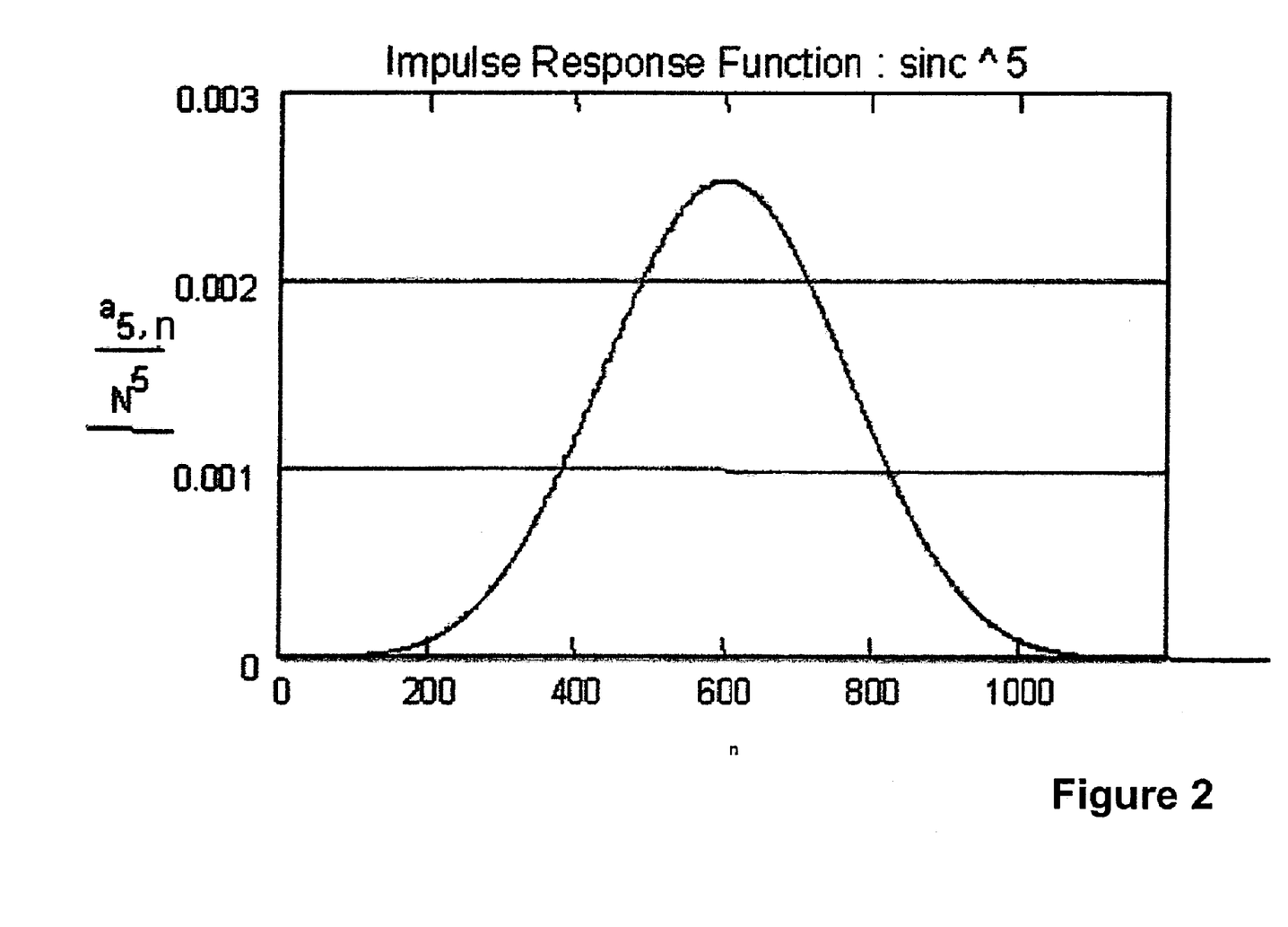
FIG. 2 shows a typical normalised impulse response for a FIR filter of FIG. 1, using calculated filter coefficients.

FIG. 2 shows the normalised Impulse response for the FIR filter with the coefficients calculated using the formula above. The normalised impulse response is the coefficients for all j divided by the aperture N raised to the power of the cascade m. The normalised impulse response is symmetrical about $n=j_{Max}/2$. Therefore, only half of the response need be retained in look up tables, so halving the amount of memory required. However, all the coefficients may be stored, is desired. With the high dynamic range of the coefficients shown in FIG. 2, the multiply-accumulate steps are carried out in an 'inwardly walking' fashion from each tail edge in turn to the centre of the normalised impulse response. This avoids the central peak swamping the output response, and allows the high end coefficients to make an adequate contribution to the response.

Figure 3:
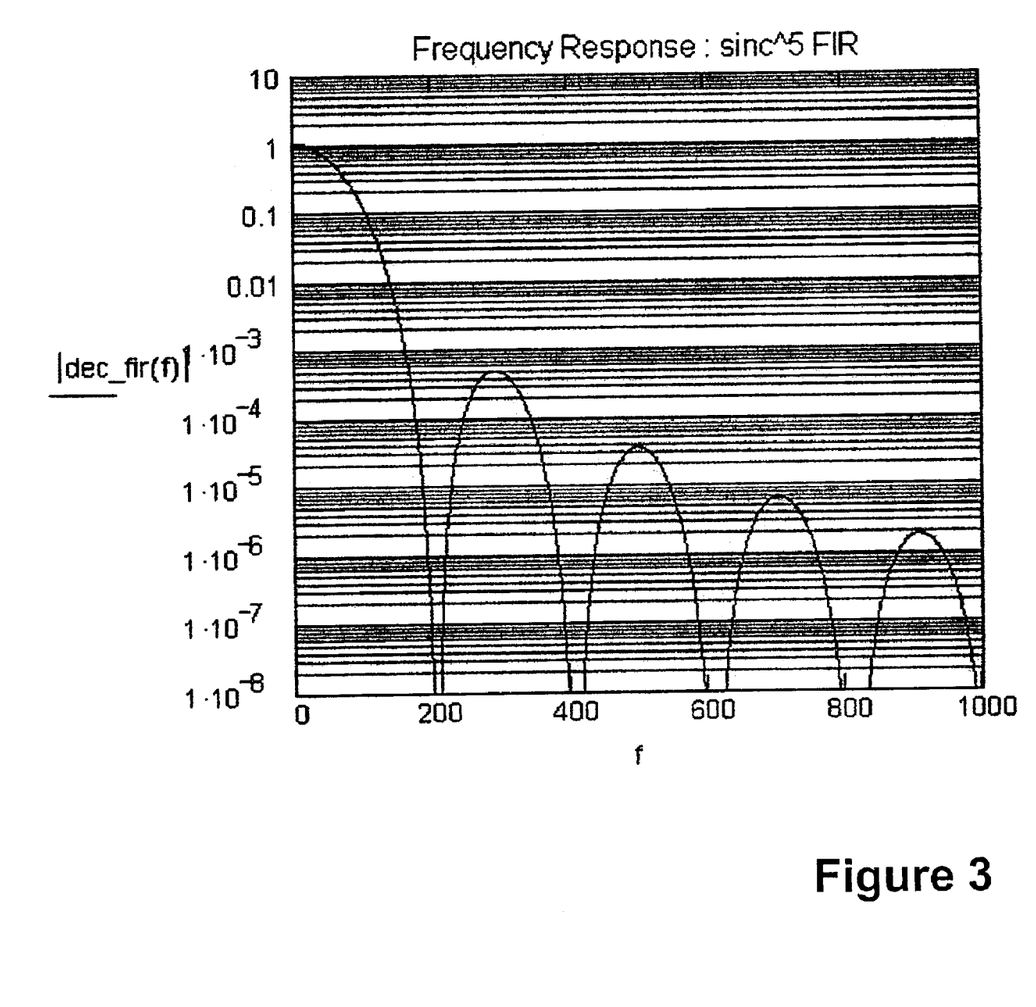
FIG. 3 shows a typical frequency response for the FIR of FIGS. 1 and 2, using the impulse response of FIG. 2.

FIG. 3 shows the frequency response for the FIR filter of FIG. 1 with the normalised impulse response of FIG. 2, calculated from the above formula. The frequency response is the same as the theoretical frequency response from a cascade of 5 moving averagers defined by the recursive equation $y_n=y_{n-1}+x_n-x_{n-N}$, for each of 5 stages of cascade, i.e. a $SINC^5$ filter. The frequency response in FIG. 3 is calculated using the formula:

$$\text{Frequency response} = \sum_n \frac{a_{m,n}}{N^m} \cdot (Z(f))^{-n}; \quad [2]$$

where $$\frac{a_{m,n}}{N^m}$$

is the normalised impulse response, m=5, n is the frequency from 0 to 1000 and $(Z(f))^{-n}$ is the discrete to frequency domain transfer function.

The convolution in the time domain is equivalent to a multiplication in the frequency domain, which gives the required frequency response, while allowing the FIR filter to be run at the down-sampled rate, rather than the sampling frequency.

Figure 4:
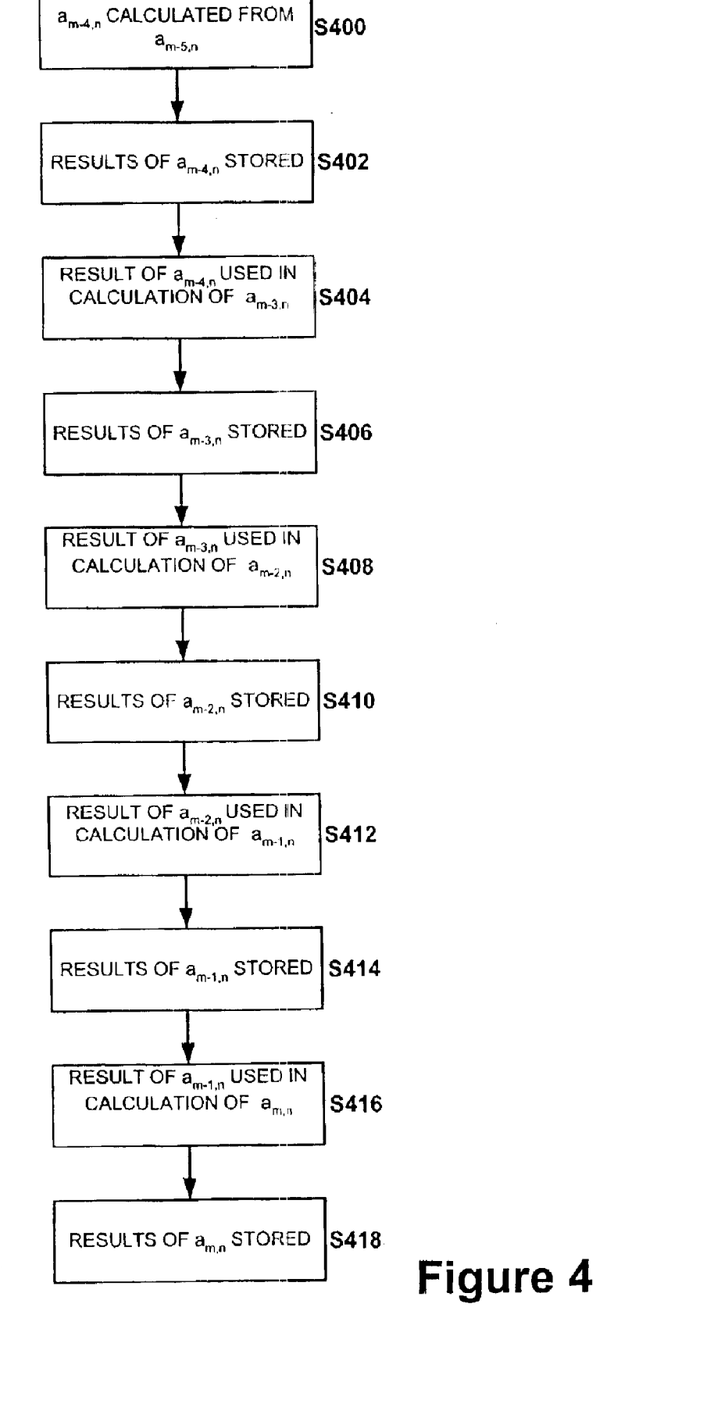
FIG. 4 shows a flow diagram illustrating a method of calculation of the coefficients of the FIR of FIG. 1.

FIG. 4 shows a flow diagram for the calculation of the coefficients of the taps in the FIR filter. The algorithm is preferably not hard-coded into the processor, but is stored, to be run at initialisation, or at other points in time, by the processor, and the coefficients stored in memory after calculation. In the present case the size of the aperture, which corresponds to the decimating ratio, is 240. The order of the filter is 5. It should be appreciated that different decimating ratios and orders of the filter can be used, in order to obtain different results. The formula of equation [1] is run for m−5, which returns the single non-zero result of 1 for n=j=1200. This result is then fed into the same formula, for m−4 at S400, the results stored in memory at S402, and this process is repeated for m−3 at S404, S406, m−2 at S408, S410, m−1 S412, S414, and m at S416. The final results for m are stored in the memory at S418 for use at run time in the filter response.

Figure 5:
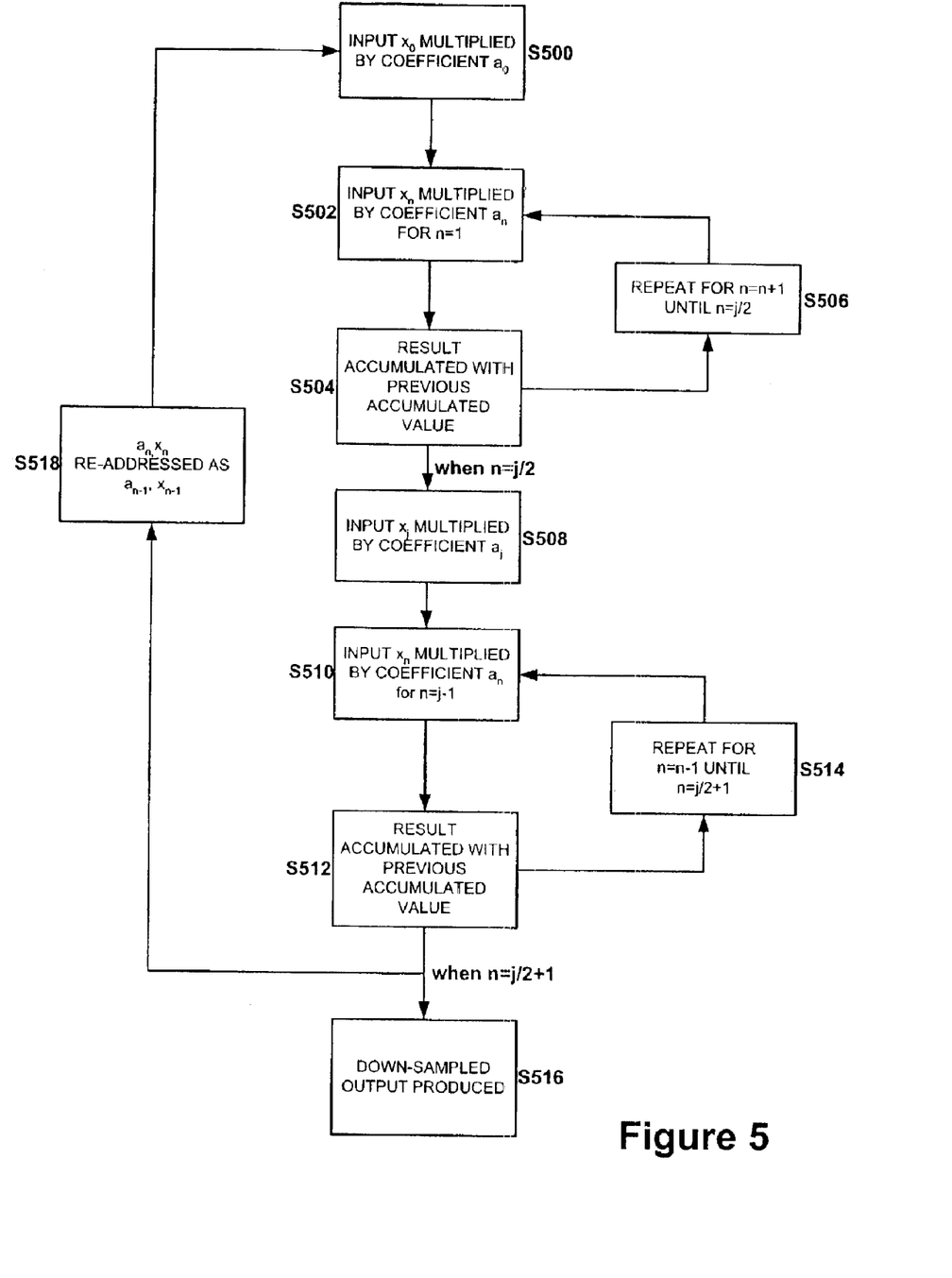
FIG. 5 shows a flow diagram of a method of operation of the FIR filter of FIG. 1.

FIG. 5 shows a flow diagram of a method of operation of the FIR filter of FIG. 1. At the first step S500, the first tap coefficient $a_0$ is retrieved from memory and is multiplied by the input $x_0$ into the FIR filter. At S502 the second tap coefficient $a_1$ is then retrieved and multiplied by the previous input $x_1$, i.e. the input value output from the first delay unit $100_a$ and the multiplied result is then added to the result from the previous step at S504. At S506, S502 and S504, i.e. the multiply-accumulate, are repeated for each tap up to the middle tap (where n=j/2). At S514 the remainder of the taps are multiply-accumulated from n=j down to n=j/2+1, in sequence by repeating steps S508, S510 and S512. At S516, the decimated sample is output from the filter. Obtaining an output takes j instruction cycles of the processor. When an output has been obtained at S516, all delays are progressed through the filter by one delay unit 100 at S518. This can be implemented by arranging a circular store of delayed input values in the delay units, where the address of each unit is changed by minus one ($100_{n+1}$, $110_{n+1}$–$100_n$, $110_n$) on each $j^{th}$ instruction cycle (i.e. on each output), with the oldest input value being replaced by the newest value, and the steps above S500–S516 being repeated with the new addressing of the delay units and taps at S518.

Figure 6:
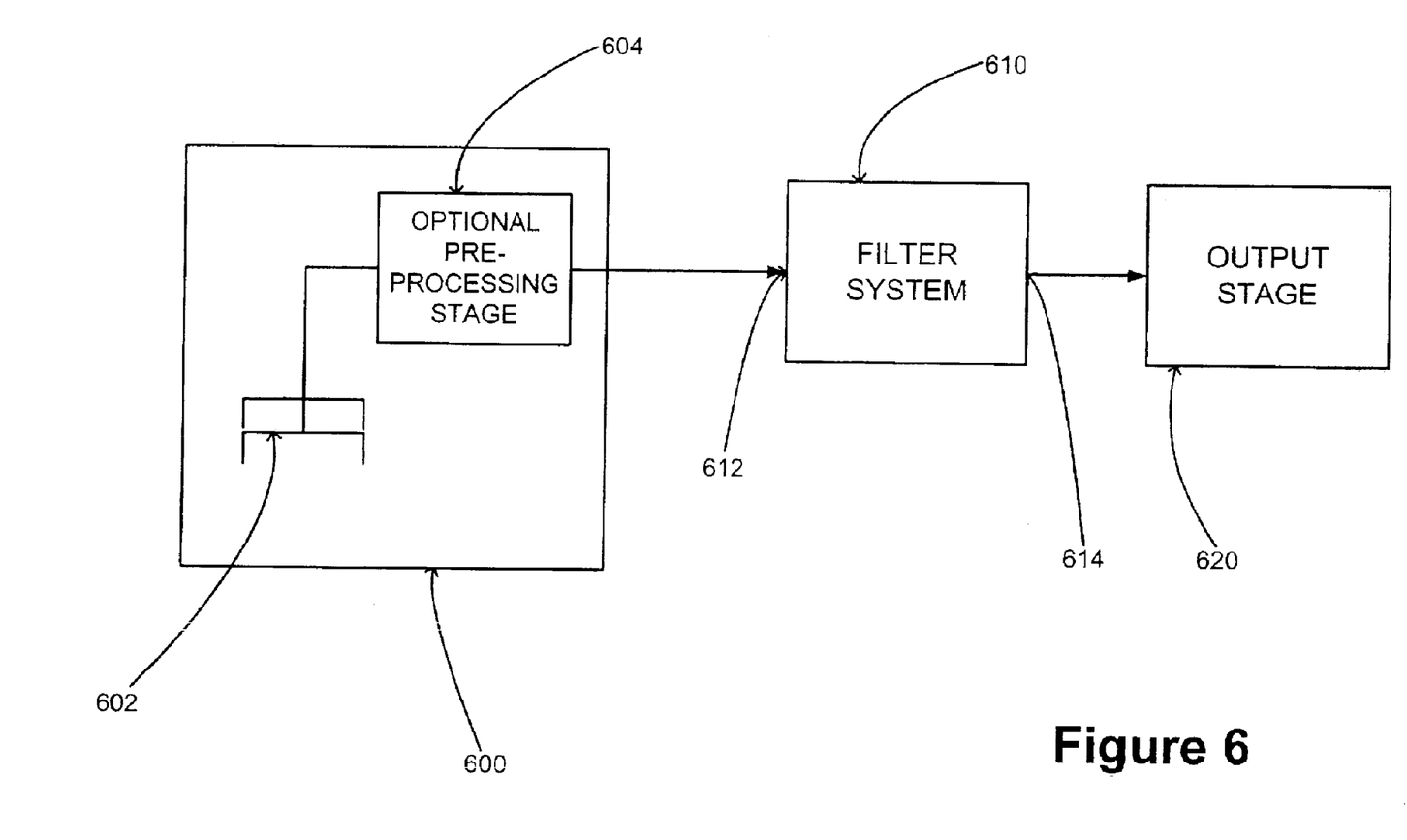
FIG. 6 is a schematic diagram of a device according to an embodiment of the invention.

FIG. 6 shows a device according to an embodiment of the invention. The device comprises a detection stage 600, a filter system 610 and an output stage 620. The detection stage 600 comprises a detector 602, which detects electromagnetic radiation emitted by the object to be detected. The detector 602 outputs a detection signal. An optional pre-processing stage 604 may be provided between the detector 602 and an input 612 to the filter system 610. The optional pre-processing stage 604 may itself filter the detection signal from the detector 602, or may be an amplifier or some other device. The optional pre-processing stage 614 allows coupling between the detector 602 and filter system 610.

The detection signal is input into the input 612 of the filter system 610. The filter operates as described above. In an embodiment of the invention, the filter system 610 also comprises at least one frequency selective filter, which, in an embodiment, is one or more low pass FIR filters. The output from the decimating filter, after being passed through the frequency selective filter(s) is combined in phase and a quadrature phase to produce a complex representation of the filtered detection original. The filter system 610 then outputs a decimated signal from its output 614 to the output stage 620. The output stage 620 need not be a final output, but may provide a signal suitable for output to a user via a further device connected to the device of the embodiment. The output stage 620 may also include further filtering and signal processing steps.

Figure 7:
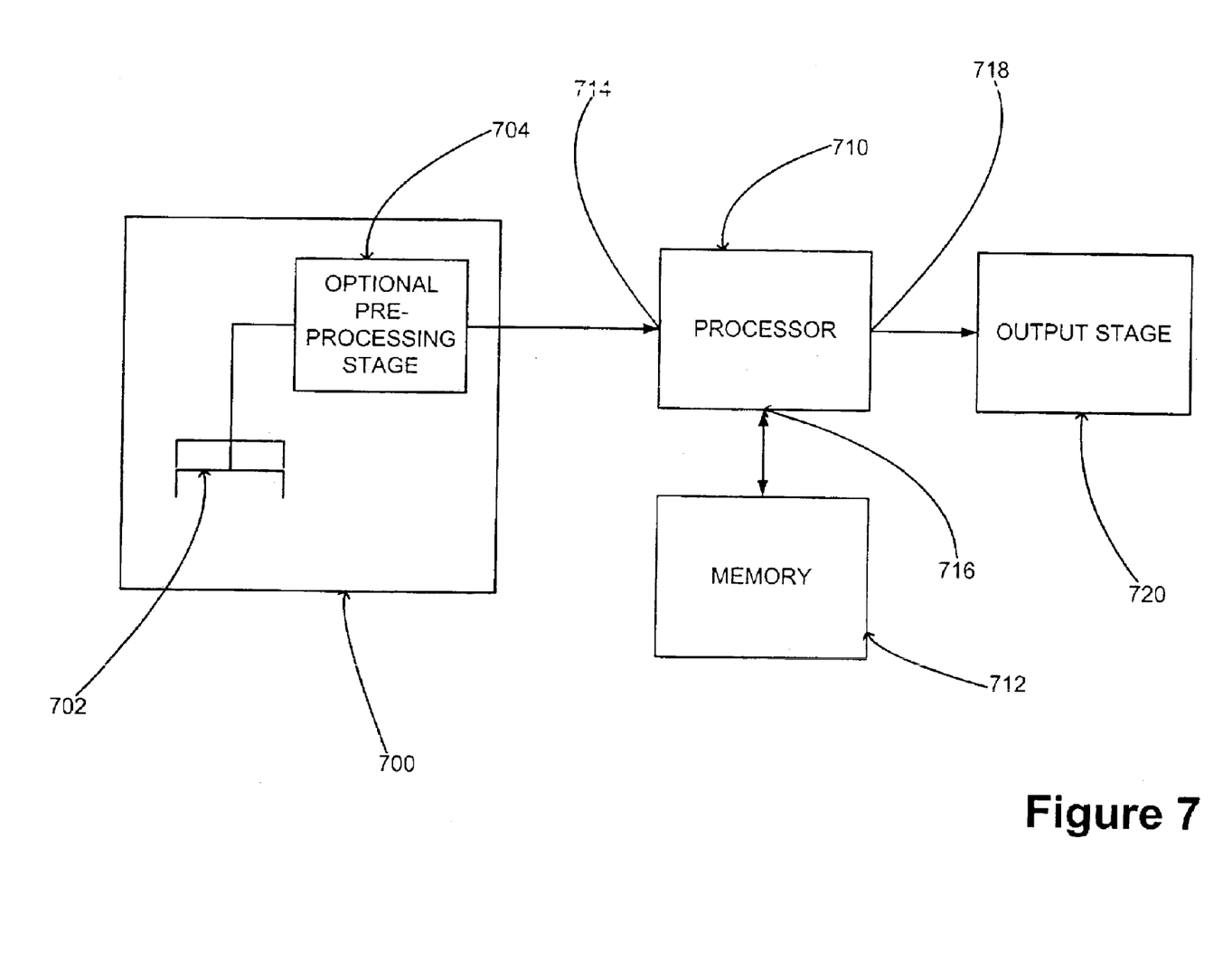
FIG. 7 is a schematic diagram of a device according to a further embodiment of the invention.

FIG. 7 shows an alternative embodiment of a device according to the invention to that shown in FIG. 6. The detection and output stages 700, 720 the same as in the embodiment shown in FIG. 6. However, the FIR filter is embodied in a processor 710 and associated memory 712. The processor has two inputs 714, 716. The first of these 714 receives the detection signal from the detection stage. The second 716 receives the coefficients for the FIR filter from the memory. The second input 716 is also an output to allow data from the processor 710 to be stored in the memory 712. In an embodiment of the invention, the processor also acts as at least one frequency selective filter, which in an embodiment is one or more low pass FIR filters.

The output from the decimating filter, after being passed through the frequency selective filter(s) is combined in phase and a quadrature phase to produce a complex representation of the filtered detection original. The output of the processor 718 outputs a decimated signal to the output 720.

Figure 8:
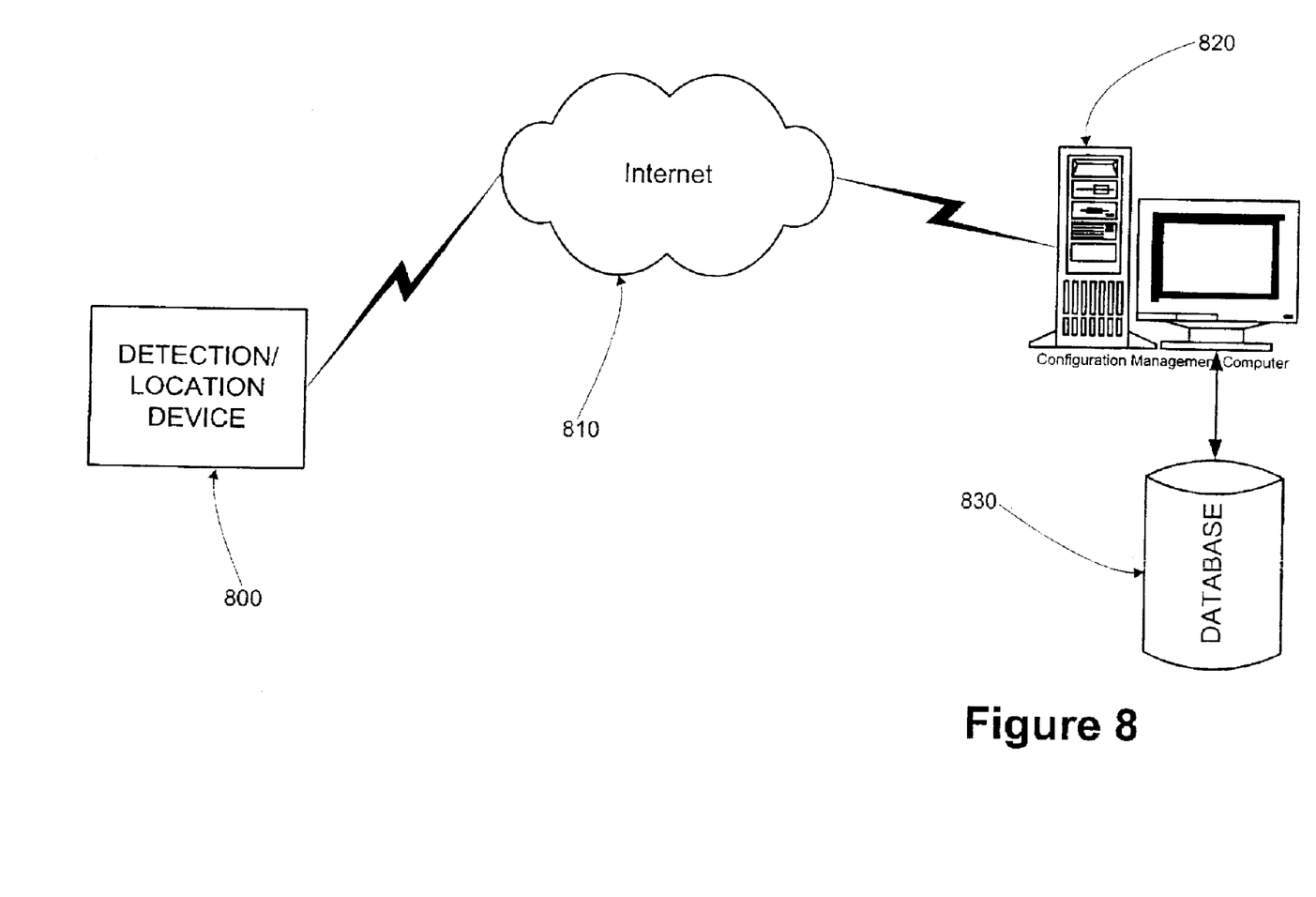
FIG. 8 is a diagram showing the remote updating and configuration of a device according to an embodiment of the invention.

FIG. 8 shows a device according to an embodiment of the invention connected to a communications network, which in this embodiment is the internet, although any data transfer network could be used, over which it can be updated and configured. Because the algorithm of the device is stored, and run either at initialisation, in response to a command, or at a set number of instruction cycles of the processor, rather than being hard-coded into the processor, it can be modified remotely. Such remote modification can be achieved simply by uploading new data instruction sets representing the algorithm, or other parameter data, such as the decimation ratio, the sampling frequency, the order of the filter, the locate bandwidth or the frequencies in which the filter is to operate. In particular, the decimation ratio acts as a hyperfine control on the locate bandwidth. This feature, in series with the locate bandwidth control, (which in this embodiment is implemented as a choice of 3 discrete filters in the pre-processing stage) effects a continuous bandwidth control of from 10 mHz to 35 Hz. The updating can be done remotely, on an individual device basis, by connecting the device to the communications network (which, in the present embodiment, is the internet), and establishing a data connection with a database holding the required information. The device can then be remote configured by an operator at the database side of the internet, and the user of the device need not have any input into the updating procedure.

The present invention can be implemented in hardware, software, firmware, and/or combinations thereof, including, without limitation, gate arrays, programmable arrays ("PGAs"), Field PGAs ("FPGAs"), application-specific integrated circuits ("ASICs"), processors, microprocessors, microcontrollers, and/or other embedded circuits, processes and/or digital signal processors, and discrete hardware logic. The present invention can be implemented with digital electronics, with analogue electronics and/or combinations of digital and analogue electronics.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A cable detection device comprising:
    a stage configured to detect an emitted signal from an object, wherein the stage produces a detection signal based upon the emitted signal;
    a memory to store coefficients of a filter system;
    a processor to act as the filter system, the processor having first and second inputs and an output, the inputs being coupled to the detection stage and the memory respectively, to filter the detection signal and output a down-sampled filtered signal with a decimation ratio of N in phase and quadrature phase; and
    an output stage, coupled to the output of the processor, to output an indication signal being indicative of the detection of a cable based upon the down-sampled filtered signal, wherein:
    the processor is arranged to act as a Finite Impulse Response (FIR) filter and at least one frequency selective filter, wherein the FIR filter has a frequency response corresponding to that of a cascade of m SINC filters, wherein m is an integer greater than 1 and the FIR filter comprises N.m taps, the coefficients having been calculated by:

$$a_{m,n} = \sum_{k=n}^{n+N} a_{m-1,k};$$

where $a_{0,n}=0$ and $a_{0,N.m}=1$.

2. A device according to claim 1, wherein the processor is a 32 bit floating point processor.

3. A method of decimating a detected signal in a cable detection device, the method comprising:
    receiving an input signal from the cable detection device;
    passing the input signal through a processor acting as a Finite Impulse Response (FIR) filter and at least one frequency selective filter, the FIR filter having a frequency response corresponding to a cascade of m SINC filters, where m is an integer greater than 1 and the FIR filter comprising N.m taps, the FIR filter decimating the input signal and outputting a down-sampled signal in phase and quadrature phase, further comprising calculating the coefficients of the FIR filter using the equation:

$$a_{m,n} = \sum_{k=n}^{n+N} a_{m-1,k};$$

where $a_{0,n}=0$ and $a_{0,N,m}=1$; and outputting an indication signal, based on the down-sampled signal, the indication signal being indicative of the detection of a cable.

4. A cable detection device comprising:
a detection stage to produce a detection signal produced in response to an emitted signal;
a filter system comprising a decimation filter, the filter system comprising an input and an output, the input being coupled to the detection stage, the filter system arranged to filter the detection signal and output a down-sampled filtered signal with a decimation ratio of N; and
an output stage, coupled to the output of the filter system, to output an indication signal being indicative of the detection of a cable based upon the down-sampled filtered signal, wherein:
the decimating filter is a Finite Impulse Response (FIR) filter having a frequency response corresponding to that of a cascade of m SINC filters, wherein m is an integer greater than 1.

5. A cable detection device according to claim 4, wherein the filter system comprises at least one frequency selective filter and the filter system is arranged to combine the filtered signal in phase and quadrature phase to produce a complex representation of the detection signal as the down-sampled filter signal.

6. A device as claimed in claim 4, wherein coefficients of the decimating filter are calculated by convolving a rectangular aperture with width N and height N×m on itself m times.

7. A device as claimed in claim 6, wherein the decimating filter comprises N.m taps, the coefficients having been calculated by:

$$a_{m,n} = \sum_{k=n}^{n+N} a_{m-1,k};$$

where $a_{0,n}=0$ and $a_{0,N,m}=1$.

8. A device as claimed in claim 4, wherein a normalised frequency response follows the response given by:

$$\sum_n \frac{a_{m,n}}{N^m} \cdot (Z(f))^{-n};$$

where f is frequency and Z(f) is the discrete to frequency domain Fourier transform.

9. A device as claimed in claim 4, wherein m=5.

10. A device as claimed in claim 4, wherein the filter system is implemented in a 32 bit floating point processor.

11. A device as claimed in claim 4, wherein the device is adapted to locate cables.

12. A cable detection device comprising:
a stage configured to detect emitted signal from an object, wherein the stages produces a detection signal based upon the emitted signal detection;
a memory to store coefficients of the filter system;
a processor, having first and second inputs and an output, the inputs being coupled to the detection stage and the memory respectively to process the detection signal and output a down-sampled filtered signal with a decimation ratio of N, wherein the processor is arranged to act as a Finite Impulse Response (FIR) filter making use of coefficients stored in the memory and having a frequency response corresponding to that of a cascade of m SINC filters, wherein m is an integer greater than 1; and
an output stage, coupled to the output of the processor, to output an indication signal being indicative of the detection of a cable based upon the down-sampled filtered signal.

13. A cable detection system as claimed in claim 12, wherein the processor is further arranged to act as at least one frequency selective filter and to combine the filtered signal in phase and quadrature phase to produce a complex representation of the filtered detection signal as the down-sampled filtered signal.

14. A device as claimed in claim 12, wherein the processor is adapted to calculate the coefficients prior to filtering using the equation:

$$a_{m,n} = \sum_{k=n}^{n+N} a_{m-1,k};$$

where $a_{0,n}=0$ and $a_{0,N,m}=1$, and to store the coefficients in the memory for use in the filtering process.

15. A method of decimating a detected signal in a cable detection device, the method comprising:
receiving an input signal generated in response to a detect signal;
passing the input signal through a Finite Impulse Response (FIR) filter, the FIR filter having a frequency response corresponding to a cascade of m SINC filters, where m is an integer greater than 1, the FIR filter decimating the input signal and outputting a down-sampled signal; and
outputting an indication signal, based on the down-sampled signal, the indication signal being indicative of the detection of a cable.

16. A method as claimed in claim 15, further comprising passing the down-sampled filter signal through at least one frequency selective filter and then combining in phase and quadrature components to produce a complex filtered representation of the detection signal as the down-sampled signal before outputting the indication signal.

17. A method as claimed in claim 15,
further comprising calculating the coefficients of the FIR filter using the equation:

$$a_{m,n} = \sum_{k=n}^{n+N} a_{m-1,k};$$

where $a_{0,n}=0$ and $a_{0,N,m}=1$, and storing the calculated coefficients in a memory, to be used to decimate the input sample.

18. A method of decimating a cable detection signal in a cable detection device, the method comprising:

receiving an input signal generated in response to an emitted signal;

processing the input signal through a processor acting as a Finite Impulse Response (FIR) filter having a frequency response corresponding to a cascade of m SINC filters, where m is an integer greater than 1, the FIR filter decimating the input signal and outputting a down-sampled signal; and outputting an indication signal, based on the down-sampled signal, the indication signal being indicative of the detection of a cable.

19. A method as claimed in claim 18, wherein the processor also acts as at least one frequency selective filter and then combines the in phase and quadrature phase components to produce a complex filtered representation of the detection signal as the down-sampled signal.

20. A method as claimed in claim 18, further comprising calculating the coefficients of the FIR filter using the equation:

$$a_{m,n} = \sum_{k=n}^{n+N} a_{m-1,k};$$

where $a_{0,n}=0$ and $a_{0,N,m}=1$ and storing the calculated coefficients in a memory, to be used to decimate the input sample.

21. A method as of claim 18, further comprising:

connecting the device to a data communications network;

receiving data, representative of instructions for calculating coefficients of the FIR filter, over the communications network to the device;

storing the data in the device, for calculation of the coefficients within the device.

22. A method as of claim 20, further comprising:

connecting the device to a data communications network;

receiving data, representative of instructions for calculating the coefficients of the filter, over the communications network; and storing the data in the device, for calculation of the coefficients of the filter by the processor.

23. A cable detector comprising:

detection means for detecting a cable and producing a detection signal;

finite impulse response filter means for receiving the detection signal and outputting a down-sampled signal, based on the detection signal; and means for outputting a signal from the finite impulse response filter means based upon the down-sampled signal, wherein:

the filter means has a frequency response corresponding to a cascade of a plurality of SINC filters.

* * * * *